United States Patent
Jaiprakash et al.

(10) Patent No.: US 6,509,226 B1
(45) Date of Patent: Jan. 21, 2003

(54) PROCESS FOR PROTECTING ARRAY TOP OXIDE

(75) Inventors: Venkatachalam C. Jaiprakash, Beacon, NY (US); Jack Mandelman, Stormville, NY (US); Ramachandra Divakaruni, Somers, NY (US); Rajeev Malik, Wappingers Falls, NY (US); Mihel Seitz, Wappingers Falls, NY (US)

(73) Assignees: International Business Machines Corporation, Armonk, NY (US); Infineon Technologies AG (DE)

(*) Notice: Subject to any disclaimer, the term of this patent is extended or adjusted under 35 U.S.C. 154(b) by 0 days.

(21) Appl. No.: 09/670,741

(22) Filed: Sep. 27, 2000

(51) Int. Cl.$^7$ .......................................... H01L 21/8242
(52) U.S. Cl. ...................... 438/243; 438/244; 438/245; 438/386; 438/387; 438/388
(58) Field of Search .................. 438/243–249, 438/386–392

(56) References Cited

U.S. PATENT DOCUMENTS

| | | | | |
|---|---|---|---|---|
| 5,075,817 A | * | 12/1991 | Butler | 438/243 |
| 5,776,808 A | * | 7/1998 | Muller et al. | 438/243 |
| 6,069,049 A | * | 5/2000 | Geiss et al. | 438/386 |
| 6,074,909 A | * | 6/2000 | Gruening | 438/242 |
| 6,184,107 B1 | * | 2/2001 | Divakaruni et al. | 438/427 |
| 6,229,173 B1 | * | 5/2001 | Gruening et al. | 257/301 |
| 6,258,659 B1 | * | 7/2001 | Gruening et al. | 438/243 |

* cited by examiner

Primary Examiner—John F. Niebling
Assistant Examiner—Jennifer M. Kennedy
(74) Attorney, Agent, or Firm—Lerner, David, Littenberg, Krumholz & Mentlik, LLP

(57) ABSTRACT

Processing of a DRAM device containing vertical MOSFET arrays proceeds through planarization of the array gate conductor (GC) polysilicon of the vertical MOSFET to the top surface of the top oxide. A thin polysilicon layer is deposited over the planarized surface and an active area (M) pad nitride and tetraethyl orthosilicate (TEOS) stack is deposited. The M mask is used to open the pad layer to the silicon surface, and shallow trench isolation (STI) etching is used to form isolation trenches. An AA oxidation is performed, the isolation trenches are filled with high density plasma (HDP) oxide and planarized to the top surface of the AA pad nitride. Following isolation trench (IT) planarization, the AA pad nitride is stripped, with the thin silicon layer serving as an etch stop protecting the underlying top oxide. The etch support (ES) nitride liner is deposited, and the ES mask is patterned to open the support areas. The ES nitride, thin polysilicon layer and top oxide are etched from the exposed areas. A sacrificial oxidation is applied along with well implants, support gate oxidation and support gate polysilicon deposition. Using the etch array (EA) mask, the support gate polysilicon is opened in the array. The ES nitride is removed selective to the underlying silicon layer, protecting the top oxide. The gate stack is deposited and patterned and the process continues to completion.

3 Claims, 5 Drawing Sheets

US 6,509,226 B1

PROCESS FOR PROTECTING ARRAY TOP OXIDE

FIELD OF THE INVENTION

The present invention generally relates to integrated circuit (IC) memory devices and, more particularly, to a process for protecting the array top oxide in vertical metal oxide semiconductor field effect transistor (MOSFET) dynamic random access memory (DRAM) arrays.

BACKGROUND DESCRIPTION

In the present process for memory cell fabrication in vertical MOSFET DRAM arrays, removal of the ES (etch stop) nitride liner from the array results in thinning of the underlying top oxide which is intended to provide insulation between the silicon substrate and the word lines to be formed subsequently. Thinning of the top oxide results in a higher than desired incidence of word line to substrate shorts and/or leakage. Furthermore, thinning of the top oxide may result in the formation of divots in the array gate conductor (GC) polycrystalline silicon (polysilicon) in the top portion of the deep trench, due to gate stack overetch. Divots in the array GC polysilicon which are deeper than the bit line diffusion (XA) junction result in non-functional array MOSFETs due to gate underlap.

SUMMARY OF THE INVENTION

It is therefore an object of the present invention to provide a protective etch stop layer under the etch supports (ES) nitride liner.

According to the invention, processing of a DRAM device containing vertical MOSFET arrays proceeds in a normal fashion through planarization of the array gate conductor (GC) polysilicon of the vertical MOSFET to the top surface of the top oxide which provides array top insulation. Then a thin polysilicon or amorphous silicon layer is deposited (new layer) over the planarized surface and the normal second pad nitride (active area (AA) pad nitride) and tetraethyl orthosilicate (TEOS) stack is deposited. The AA mask is used to open the pad layer to the silicon surface, and standard shallow trench isolation (STI) etching is used to form isolation trenches. An AA oxidation is perfomed, the isolation trenches are filled with high density plasma (HDP) oxide and then planarized to the top surface of the AA pad nitride (the TEOS layer overlying t he second pad nitride having been polished off). Following isolation trench (IT) planarization, the AA pad nitride is stripped, with the thin silicon layer serving as an etch stop protecting the underlying TTO. The standard etch support (ES) nitride liner is then deposited, and the process continues with the patterning of the ES mask which opens the support areas. The ES nitride, thin polysilicon layer and TTO are etched from the exposed areas. Next, a sacrificial oxidation is applied along with well implants, support gate oxidation and support gate polysilicon deposition. Then, using the etch array (EA) mask, the support gate polysilicon is opened in t he array. The ES nitride is removed selective to the underlying silicon layer, protecting the TTO. The gate stack is deposited and patterned and the process continues to completion.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
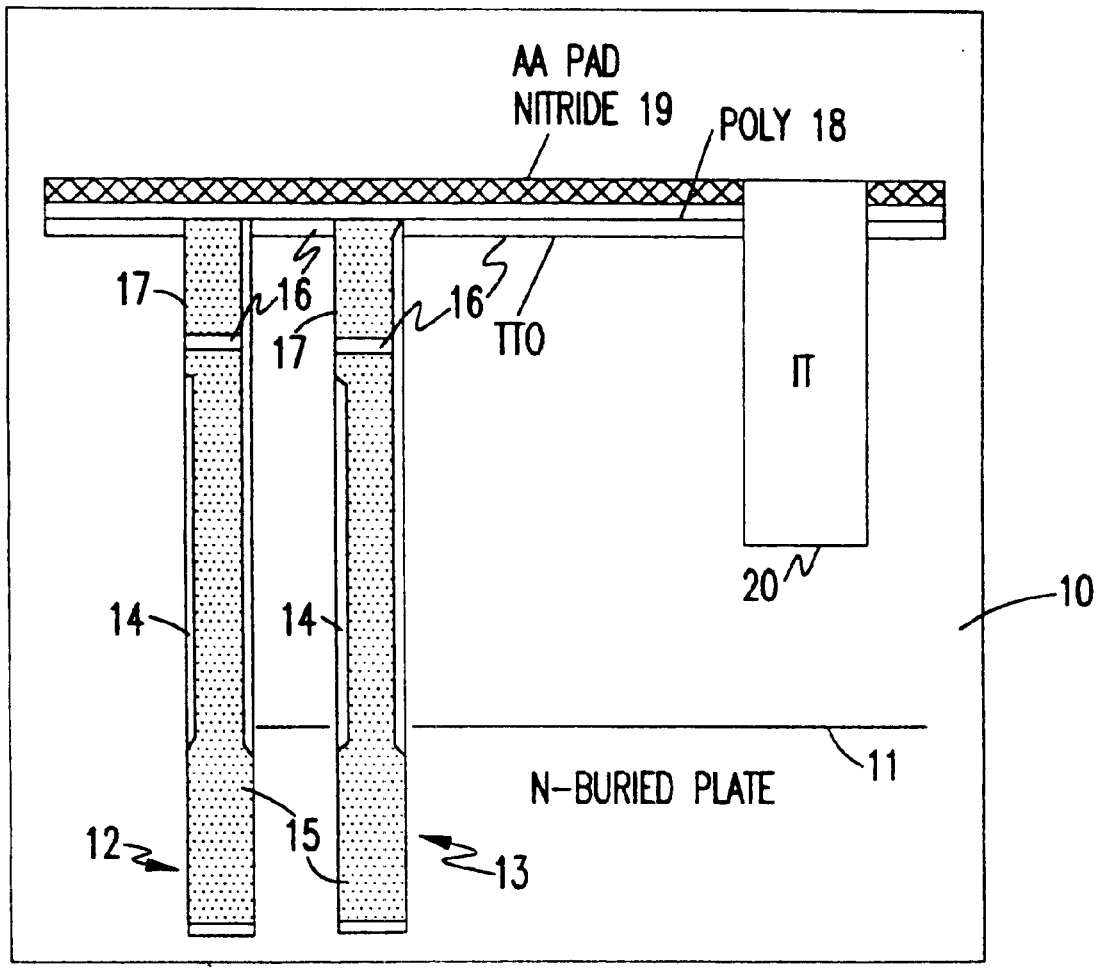
FIG. 1 is a cross-sectional view showing a thin layer of polysilicon or amorphous silicon deposited following array gate CMP to the top surface of the top oxide and following formation of the isolation trenches (ITs)

Referring now to the drawings, and more particularly to FIG. 1, there is shown a cross-sectional view of a section of a DRAM containing vertical MOSFET arrays formed in a silicon substrate 10. The substrate 10 has an n-buried plate 11 through which two trenches 12 and 13 have been formed from the top surface of the substrate. A collar oxide 14 is formed within each of the trenches to just below the n-buried plate 11, and then the trenches are filled with polysilicon 15 which acts as the conductor for the storage node. Prior to deposition of polysilicon 15, a storage node insulator is formed. A top oxide 16 deposited on the surface of the substrate 10 extends into the trenches 12 and 13 to cover the tops of the polysilicon 15. Above the top oxide 16 on the surface of the substrate and in the trenches is deposited polysilicon 17 which serves as the gate conductors (GC) for the DRAM cell. Prior to deposition of polysilicon 17, a gate oxide is formed. The top oxide 16 within the trenches 12 and 13 thus serves as an insulating layer between the GC and the storage node polysilicon.

The processing of the DRAM proceeds in a normal fashion through planarization, by chemical-mechanical polish (CMP), of the array GC polysilicon 17 of vertical MOSFETs to the top surface of the top oxide 16, which provides array top insulation. Then a thin polysilicon or amorphous silicon layer 18 is deposited over the planarized surface. This new layer of polysilicon or amorphous silicon layer 18 is a new layer in the process and serves as an etch stop (for overlying nitride layers) and a buffer layer, protecting the underlying top oxide 16 from damage and erosion due to subsequent processing. The normal second pad nitride 19 (AA pad nitride) and TEOS stack is deposited. The AA mask is used to open the pad layer to the silicon surface and standard STI (shallow trench isolation) etching is used to form isolation trenches (IT) 20. An AA oxidation is performed, the isolation trenches 20 are filled with HDP oxide and then planarized to the top surface of the AA pad nitride.

Figure 2:
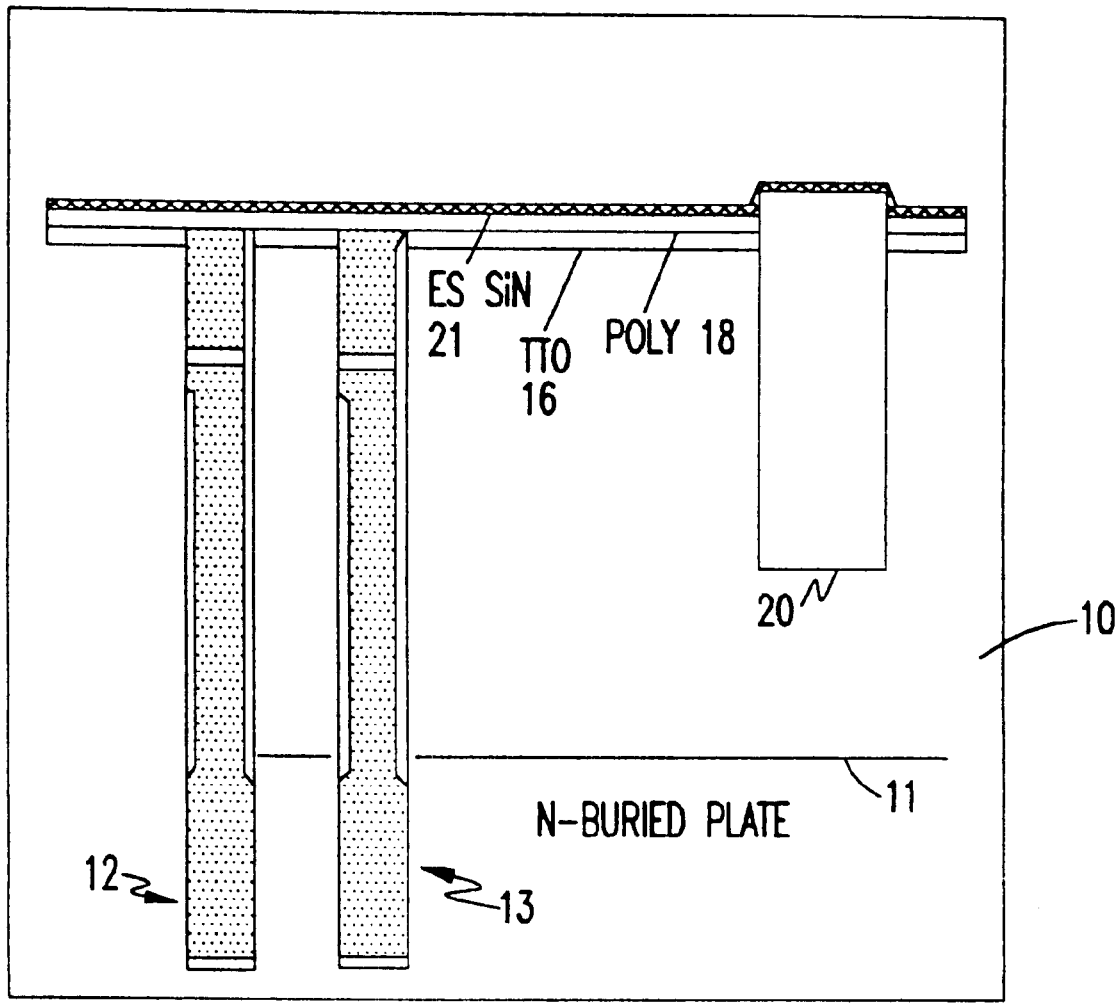
FIG. 2 is a cross-sectional view showing the AA pad nitride stripped and the standard ES nitride layer deposited.
Figure 3:
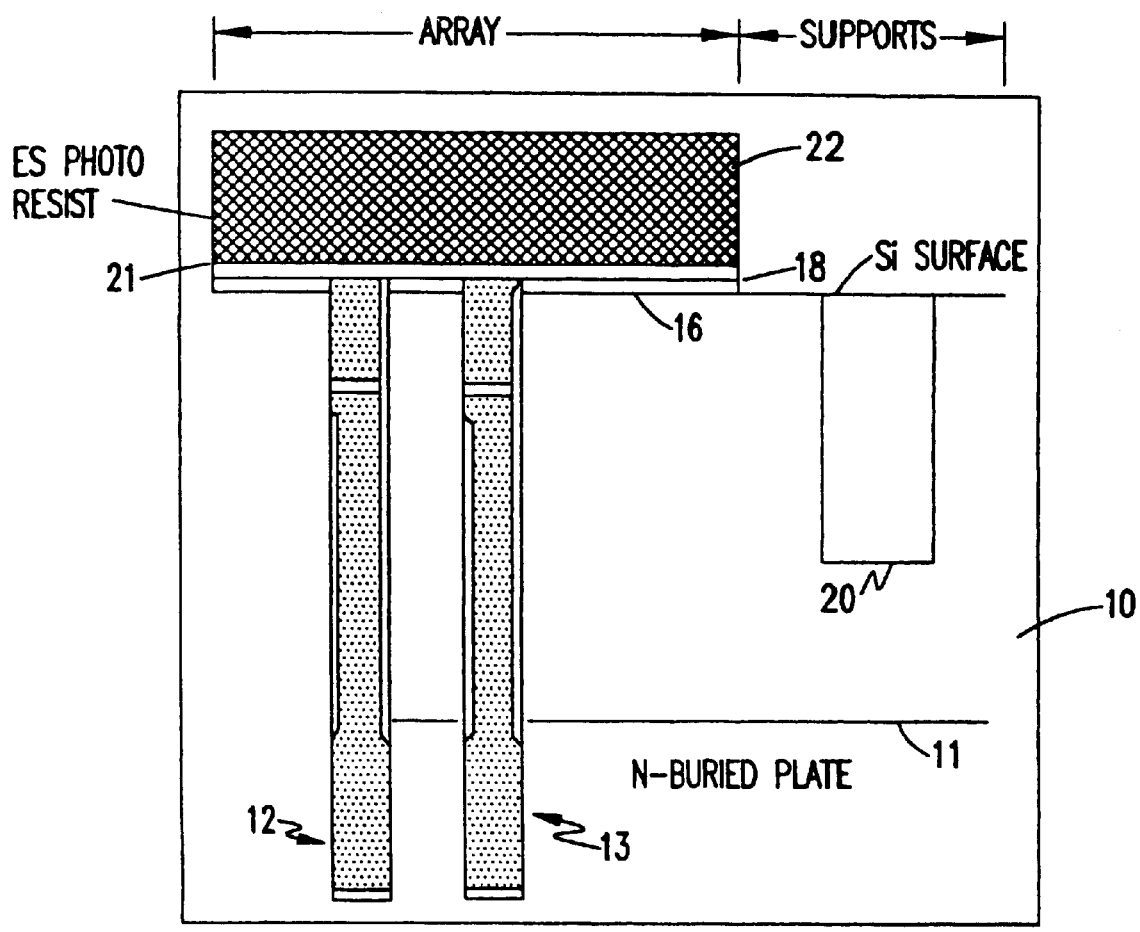
FIG. 3 is a cross-sectional view showing the patterning of the ES mask followed by the ES nitride, thin polysilicon layer and TTO is etched from the exposed areas.

Referring next to FIG. 2, following STI planarization, the AA pad nitride is stripped, with the thin silicon layer serving as an etch stop which protects the underlying TTO 16. Then the standard ES nitride liner 21 is deposited. The process continues with the patterning of the ES mask 22 which opens the support areas. The ES nitride 21, thin polysilicon layer 18 and top oxide 16 are etched from the exposed areas, in the supports, as shown in FIG. 3.

Figure 4:
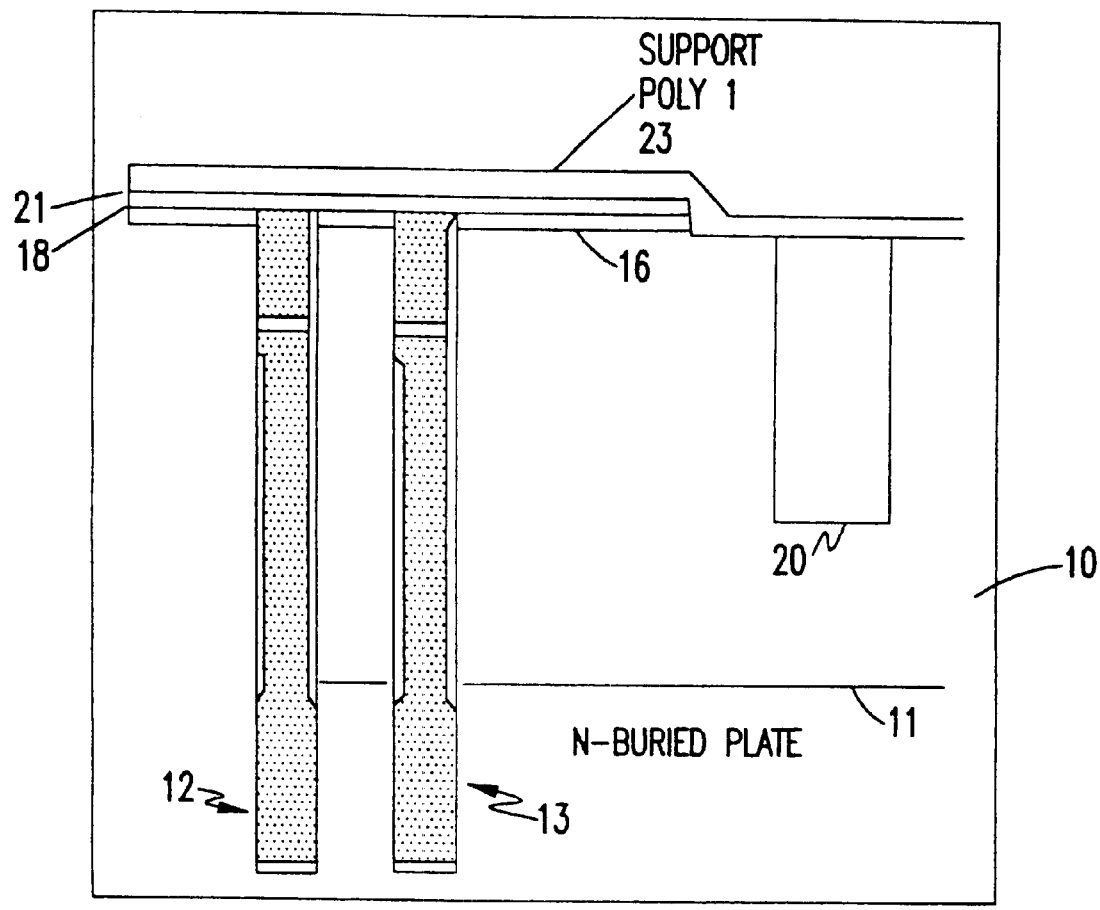
FIG. 4 is a cross-sectional view showing the results of sacrificial oxidation, well implants, support gate oxidation and first layer of polysilicon deposition which serves as a portion of the gate conductor for the support MOSFETs.
Figure 5:
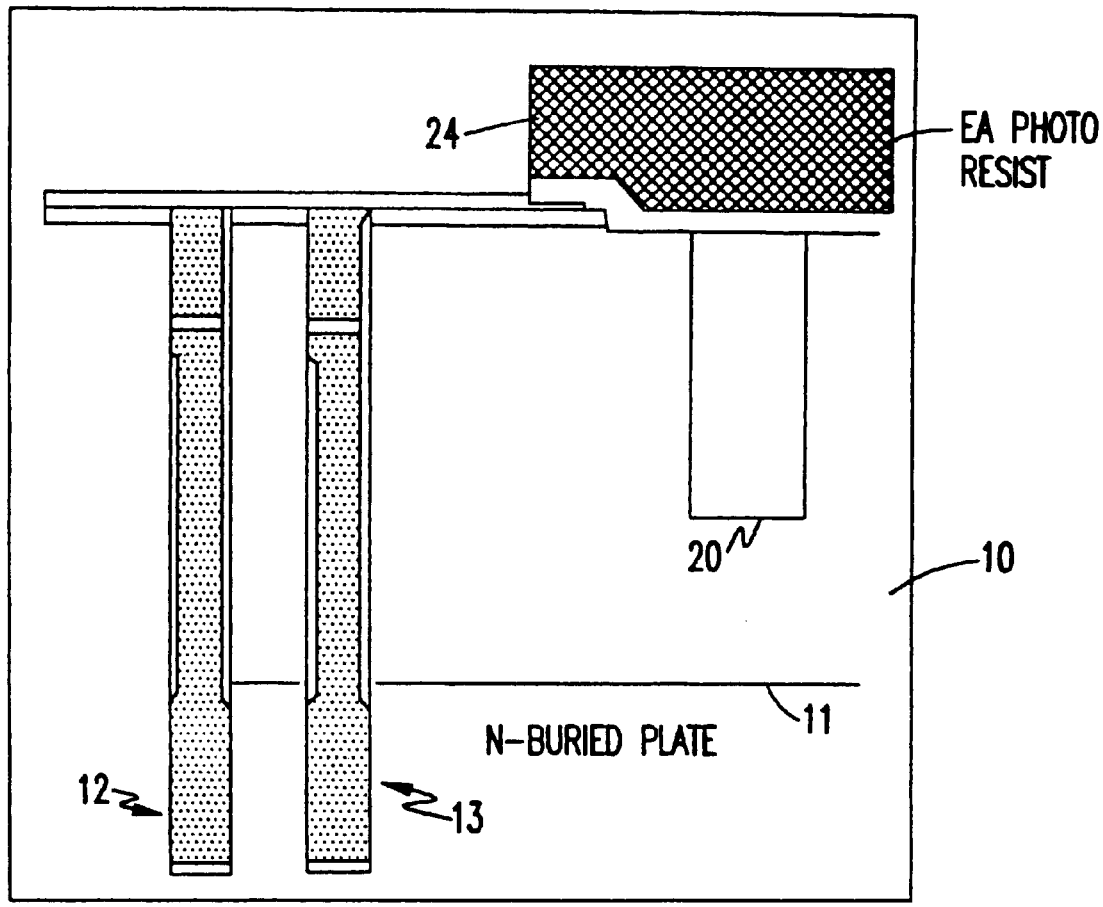
FIG. 5 is a cross-sectional view showing the opening the first layer polysilicon using the EA mask and removal of the ES nitride selective to the underlying silicon layer.

The process continues with sacrificial oxidation, well implants, support gate oxidation and the first layer polysilicon 23 deposition, as shown in FIG. 4. This first layer of polysilicon serves as a portion of the gate conductor for the support MOSFETs. Then, using the EA mask 24, the first layer polysilicon 23 is opened in the array. ES nitride is removed selective to the underlying thin silicon layer, protecting the TTO, as shown in FIG. 5. The EA resist is stripped. The gate stack is deposited and patterned, and the standard process continues to completion.

An additional embodiment would deposit the thin silicon barrier layer following IT planarization instead of following array GC planarization. This alternative embodiment has the additional advantage of protecting the STI from recess during subsequent removal of the ES nitride liner layer.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. In a process for protecting an array top oxide layer in the manufacture of vertical metal oxide semiconductor field effect transistor (MOSFET) dynamic random access memory (DRAM) arrays in a silicon substrate, the improvement comprising the step of depositing a thin polysilicon or amorphous silicon layer over the top oxide layer which serves as an etch stop and protects the underlying top oxide layer from etch damage, and planarizing an array gate conductor (GC) polysilicon of the vertical MOSFET to the top surface of the top oxide prior to the depositing the thin polysilicon or amorphous silicon layer over the top oxide layer.

2. The process of claim 1, further comprising the steps of:
   depositing an active area (AA) pad nitride and tetraethyl orthosilicate (TEOS) stack over the thin polysilicon or amorphous silicon layer;
   opening the AA pad nitride to the silicon surface of the substrate;
   etching shallow trench isolation (STI) to form isolation trenches;
   filling the isolation trenches with high density plasma (HDP) oxide; and
   planarizing to the top surface of the AA pad nitride and stripping the AA pad nitride, with the thin polysilicon or amorphous silicon layer serving as an etch stop protecting the underlying top oxide thereby avoiding thinning of the top oxide and preventing word line to substrate shorts and/or leakage.

3. A process for protecting an array top oxide in the manufacture of vertical metal oxide semiconductor field effect transistor (MOSFET) dynamic access memory (DRAM) arrays in a silicon substrate, comprising the steps of:
   planarizing an array gate conductor (GC) polysilicon of the vertical MOSFET to a top surface of the top oxide;
   depositing a thin polysilicon layer over the planarized surface;
   depositing an active area (AA) pad nitride mask and tetraethyl orthosilicate (TEOS) stack;
   using the AA pad nitride mask to open a pad layer to the silicon surface of the substrate;
   performing shallow trench isolation (STI) etching to form isolation trenches;
   filling the isolation trenches with high density plasma (HDP) oxide and planarizing to a top surface of the AA pad nitride mask;
   stripping the AA pad nitride mask, with the thin polysilicon layer serving as an etch stop protecting the underlying top oxide;
   depositing an etch support (ES) nitride liner, patterning an ES mask to open support areas, and etching the ES nitride liner, thin polysilicon layer and top oxide from exposed areas; and
   using an etch array (EA) mask, opening the support gate polysilicon in the array, and removing the ES nitride liner selective to the underlying polysilicon layer, protecting the top oxide.

* * * * *

UNITED STATES PATENT AND TRADEMARK OFFICE
CERTIFICATE OF CORRECTION

PATENT NO.    : 6,509,226 B1
DATED         : January 21, 2003
INVENTOR(S)   : Venkatachalam C. Jaiprakash et al.

It is certified that error appears in the above-identified patent and that said Letters Patent is hereby corrected as shown below:

<u>Title page</u>,
Item [57], ABSTRACT,
Line 5, "(M)" should read -- (AA) --.
Line 7, "M" should read -- AA --.

<u>Column 1</u>,
Line 4, insert -- BACKGROUND OF INVENTION --.
Lines 47 and 58, "t he" should read -- the --.

Signed and Sealed this

Twenty-sixth Day of August, 2003

JAMES E. ROGAN
*Director of the United States Patent and Trademark Office*